United States Patent [19]

Hasenberg et al.

[11] Patent Number: 4,788,688
[45] Date of Patent: Nov. 29, 1988

[54] HETEROSTRUCTURE LASER

[75] Inventors: Thomas C. Hasenberg, Los Angeles; Elsa M. Garmire, Manhattan Beach, both of Calif.

[73] Assignee: University of Southern California, Los Angeles, Calif.

[21] Appl. No.: 876,942

[22] Filed: Jun. 20, 1986

[51] Int. Cl.$^4$ .......................... H01S 3/19; H01L 27/12
[52] U.S. Cl. ........................................ 372/45; 357/16; 357/17; 357/4; 372/46
[58] Field of Search ............... 372/44, 45, 46; 357/16, 357/17, 4 SL

[56] References Cited

U.S. PATENT DOCUMENTS 4,599,728  7/1986  Alavi et al. ............................ 372/45

FOREIGN PATENT DOCUMENTS 2131610  6/1984  United Kingdom .................. 372/45

OTHER PUBLICATIONS

Yano et al., Appl, Phys. Lett. 41 (5) 390 (1982).
Yano et al., IEEE Journal of Quantum Electronics, QE-19 No. 8, 1319 (1983).

Primary Examiner—William L. Sikes
Assistant Examiner—Georgia Y. Epps
Attorney, Agent, or Firm—Nilsson, Robbins, Dalgarn, Berliner, Carson & Wurst

[57] ABSTRACT

A semiconductor laser of the heterostructure type is grown on a p-type substrate and has a plurality of p-type active layers. In a preferred embodiment, the active layers are grown by liquid phase epitaxy from a single melt which is maintained just below its equilibrium temperature and is cooled very slowly during deposition. As a result, the active layers are substantially identical in composition and have a very low lattice mismatch. They emit light at characteristic wavelengths within 50 angstroms of each other, indicating that their modal gain envelopes coincide. This condition minimizes the threshold current.

15 Claims, 5 Drawing Sheets

HETEROSTRUCTURE LASER

This invention was made with Government Support under Contract No. F49629-85-C-0071 awarded by the Joint Services Electronics Program which is administered by the Air Force Office of Scientific Research. The Government has certain rights in the invention.

BACKGROUND OF THE INVENTION

The present invention relates generally to the field of heterostructure lasers and, more particularly, to a laser having matched quaternary active layers which give rise to a low threshold current and high thermal stability.

Optical communications systems and fiber sensors require light to be transmitted through long lengths of optical fiber. Common silica fibers exhibit low loss and low dispersion at wavelengths of 1.3–1.55 microns (0.95–1.1 electron volts). Thus far, it has not been possible in the GaAs/AlGaAs material system to produce lasers with bandgaps within this range. However, it is known that quaternary materials such as InGaAsP can be grown lattice-matched to InP within a broad bandgap range by independent variation of components controlling bandgap and lattice constant. Using these materials, one can produce devices having bandgaps which fall within the desired range for optical fibers.

Lasers based on InGaAsP/InP exhibit longer lifetimes and greater resistance to facet damage than their GaAs/AlGaAs counterparts, making them prime candidates for high power and long lifetime applications, such as optical communication. However, InGaAsP/InP lasers have heretofore been plagued with a temperature-sensitive threshold current which can lead to device failure in applications where heat sink temperatures approach 50 degrees Celsius. This temperature dependence is expressed mathematically as low values of $T_o$ in the exponential expression for threshold current ($J_{th} = J_{tho} e^{T/T_o}$). It has been the subject of considerable investigation and results in large part from carrier leakage over the barrier at the heterostructure of the laser. Because the energy of the carriers increases exponentially with temperature, one would expect carrier leakage to increase dramatically with temperature. Electron leakage dominates in these devices because the effective mass of electrons is an order of magnitude smaller than that of holes.

A quaternary heterostructure laser which is useful in the 1.3 micron range and significantly reduces carrier leakage is disclosed by Yano et al., *Appl. Phys. Lett.* 41 (5), 390 (1982) and Yano et al. *IEEE Journal of Quantum Electronics*, QE-19 No. 8, 1319 (1983). The Yano device, called a "double carrier confinement" (DCC) laser, employs two active layers of InGaAsP one p-type and the other either n-type or undoped, separated by a thin p-type InP separation layer. Electrons which leak from the first active layer diffuse across the separation layer and have a second chance to radiatively recombine in the second active region. Yano et al. disclose DCC lasers with $T_o$ values of 180 degrees Kelvin and thresholds of 4.6 kA/cm². This $T_o$ value is 3 times larger than that of a typical 1.3 micron laser, but the threshold current is undesirably large. Devices with such large threshold currents are inefficient in operation and are prone to thermal runaway.

SUMMARY OF THE INVENTION

The present invention relates to a semiconductor laser having: a p-type substrate with a lower electrode for establishing an electrical connection to the substrate; a lower confining layer overlying the substrate; a composite active region formed on the lower confining layer, the composite region having at least two p-type active regions separated by one or more separation layers; an n-type upper confining layer formed on the composite region to produce a p-n junction therewith; an upper electrode for establishing electrical connection to the upper confining layer; the active layers having bandgaps smaller than the bandgaps of the confining layers and the separation layers; and apparatus for applying an electrical potential between the upper electrode and the lower electrode to inject charge carriers into the active layers. In a preferred embodiment, the composite region has a lower active region and an upper active region on opposite sides of the separation layer and the active regions are substantially identical in composition. The active regions are preferably grown from the same melt by a process of liquid phase epitaxy.

Many of the advantages of the present invention result in large part from the fact that the laser is grown on a p-type substrate and the fact that the active layers of the laser are substantially identical in composition and structure. When the characteristic wavelengths of light emitted by the active layers are very close to each other, as they are when the active layers are the same composition, the modal gain envelopes coincide. This is true when the wavelengths of the active layers are within 50 angstroms of each other, and is even more pronounced when they are within 20 angstroms. The result is an efficient device having low threshold current and high temperature stability, making it ideal for use at wavelengths preferred for optical communications.

Devices having threshold currents as low as 2.8 kA/cm² and $T_o$ values of 180 degrees Kelvin have been produced in accordance with the invention. Threshold current was reduced to 2.2 kA/cm² in a device having extremely thin active and separation layers, but $T_o$ then fell to 106 degrees Kelvin. Both of these currents are far less than the lowest reported value of 4.6 kA/cm² for prior DCC lasers with similar dimensions.

The growth of DCC lasers on p-type substrates is contrary to the teachings of the prior art, which contemplates growing such devices only on n-type substrates. However, devices grown on n-type substrates are subject to structural constraints. For example, the first active layer cannot be p-type if the substrate is n-type because the acceptor impurity (typically zinc in quaternary materials of greatest interest) would diffuse into the confining layer from the p-type melt. However, the second active layer must be p-type for the device to work. Thus, the two active layers will always be different in conductivity type, making it difficult to achieve the required homogeneity between them. Use of a p-type substrate also provides a broad area contact to the p-type side of the device, relieving problems of high contact resistivity associated with the p-type material.

Compositional homogeneity of the active layers is achieved by growing them from a single melt. This technique requires a total of only three melts, one to deposit the lower confining layer and all separation layers between the active layers, a second to deposit all active layers, and a third to deposit the other confining layer. This is contrary to the commonly held belief that it is not feasible to reuse melts because a first deposition would necessarily deplete dilute constituents or because the time-lapse between growth periods would cause the depositions to be at significantly different temperatures. It was also believed before the present invention that "sliders" used in liquid phase epitaxy could be moved only in one direction.

BRIEF DESCRIPTION OF THE DRAWINGS

The above and other features of the present invention may be more fully understood from the following detailed description, taken together with the accompanying drawings wherein similar reference characters refer to similar elements throughout, and in which.

DESCRIPTION OF THE PREFERRED EMBODIMENT

The laser of the present invention has a number of semiconductor layers of different bandgaps. For convenience, differences in bandgap are indicated in the following description by the use of lower case letters ("n" and "p") to refer to the conductivity type of layers of relatively low bandgap and the use of upper case letters ("N" and "P") to refer to the conductivity type of layers of higher bandgap, as is customary in the field. However, for purposes of generality, only lower case letters are used in the claims. All bandgap limitations are recited specifically in the claims to which they apply.

Figures 1, 2:
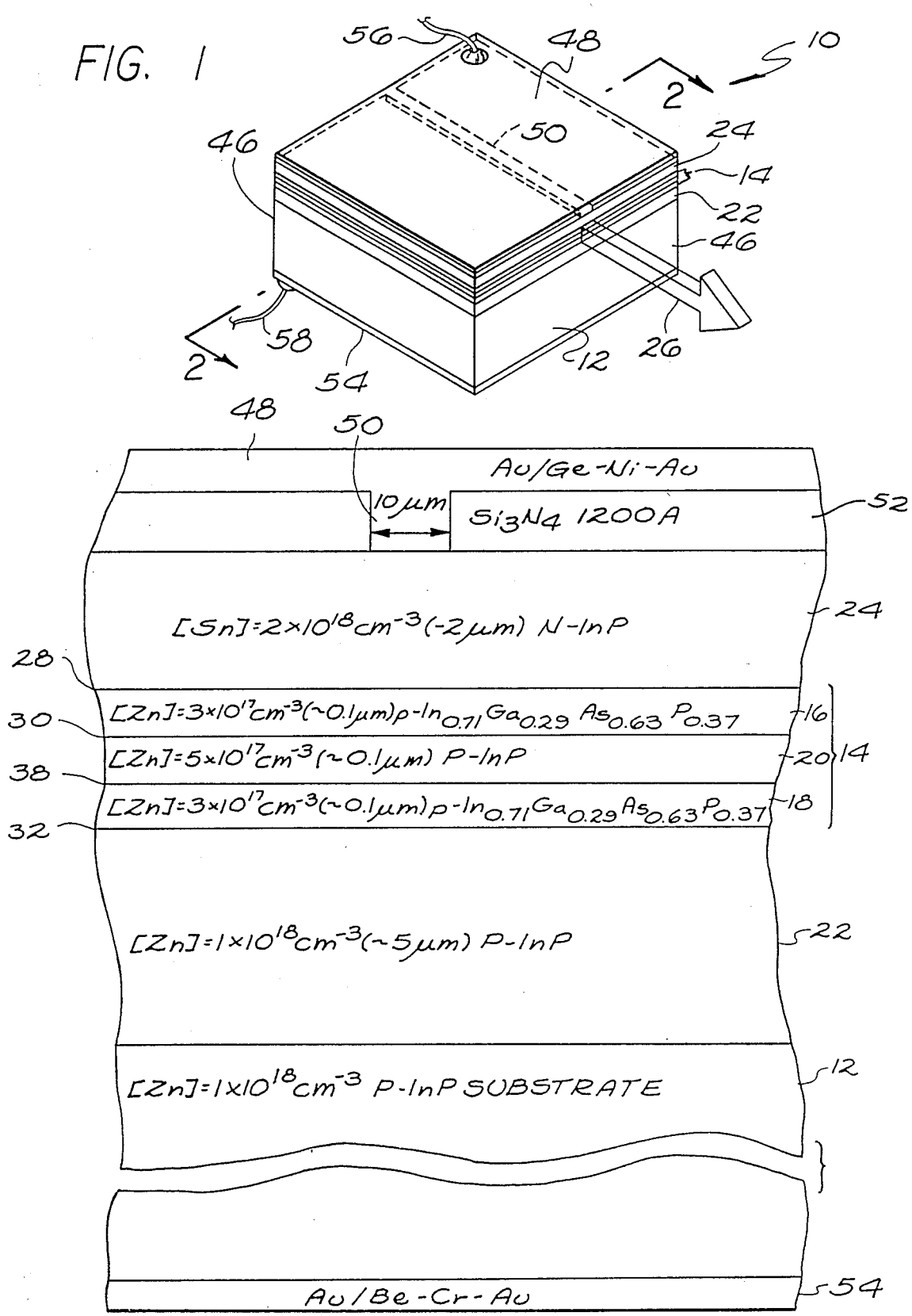
FIG. 1 is an isometric view showing an exemplary embodiment of a stripe geometry laser constructed in accordance with the invention.
FIG. 2 is a fragmentary cross-sectional view of the laser of FIG. 1, taken along the line 2—2.

Referring now to the drawings, specifically FIGS. 1 and 2, one form of a laser 10 constructed according to the present invention is grown on a p-type substrate 12 and has a composite active region 14 containing at least a lower active layer 18 and an upper active layer 16. The active layers 16 and 18 are substantially identical in composition and structure and are the same conductivity type (p-type). They are separated from each other by a separation layer 20 and from the surrounding layers of the device by a lower confining layer 22 and an upper confining layer 24, all of which are higher in bandgap than the active layers.

The layers of high band gap on either side of the active layers 18 and 16 tend to confine injected carriers within the active layers. These confined carriers are then available for efficient radiative recombination which results in photon emission. Because there are at least two active layers, they can act as independent sources of spontaneous emission. Since the active layers are extremely close in composition and lattice parameters, their modal gain peaks occur at essentially the same wavelength. This minimizes threshold current and yields a high $T_o$.

Extreme compositional and structural similarity is achieved by depositing the active layers from the same melt while the temperature of the melt falls very slowly from a point near its thermal equilibrium. As described above, this is made possible by the use of a P-type substrate. The substrate 12, the active layers 18 and 16, the confining layers 22 and 24, and the separation layer 20, can then be of the same conductivity type.

Turning to FIGS. 1 and 2 in greater detail, the active layers 16 and 18 are preferably made of a quaternary material, such as InGaAsP, and the substrate, the confining layer and the separation layer are preferably InP. The p-type dopant for both materials is preferably zinc and the n-type dopant is preferably tin. Quaternary materials are preferred for the active layers 16 and 18 because their bandgaps can be controlled independently of lattice parameters to control the wavelength of light emitted.

The substrate 12 is preferably single-crystal P-type InP, onto which the lower confining layer 22 of similar composition is grown by liquid phase epitaxy. The composite active region 14 is then grown on the lower confining layer 22 to a total thickness of approximately 0.3 micron, using one melt for both active layers. Between the active layers, the separation layer 20 is formed of the same P-InP material as the confining layer 22, and preferably from the same melt. The last semiconductive layer is the upper confining layer 24, which is N-type InP. It is grown to a thickness of approximately 2 microns from a third melt in which tin is used as a dopant. The problem of a misplaced junction between the p-type active layer 16 and the adjoining N-type confining layer 24 is avoided in this configuration because the N-type dopant (tin) diffuses much less readily than the p-type dopant (zinc). The N-type dopant does not diffuse appreciably into the first active layer 16, even though it is present in the molten state.

Figure 3:
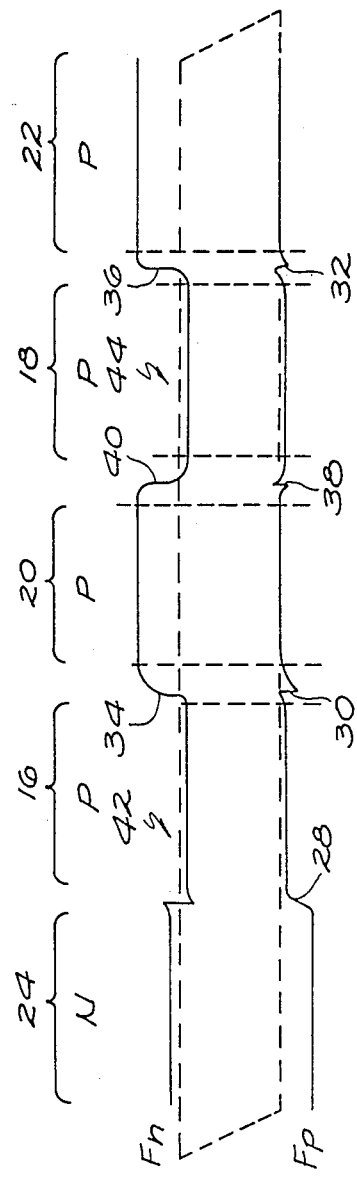
FIG. 3 is a diagram of the band structure within the laser of FIG. 1.

From the above, it will be understood that a p-n junction is present at the interface 28 of the upper confining layer 24 and the first active region 16. This is the only p-n junction in the device. The remaining interfaces between layers are isotype heterojunctions or homojunctions. For example, the interface 30 between the upper active layer 16 and the separation layer 20, and the interface 32 between the lower active layer 18 and the confining layer 22, are both p-P heterojunctions which serve as potential barriers to confine charge carriers within the active layers until they can radiatively recombine. This is illustrated in FIG. 3 by the presence of a first potential barrier 34 between the upper active layer 16 and the separation layer 20 and a second potential barrier 36 between the lower active layer 18 and the lower confining layer 22. The interface 38 between the separation layer 20 and the lower active layer 18 is a P-p heterojunction which provides a potential barrier 40 in the opposite direction to further confine charge carriers within the second active layer. Thus, the upper active layer 16 and the lower active layer 18 provide upper and lower potential wells 42 and 44, respectively (FIG. 3). It is within these wells that charge carriers are confined until recombination occurs, emitting light corresponding to the bandgaps of the active layers.

An optical cavity is provided in the body of the laser 10 by a pair of optically smooth surfaces or "facets" 46 formed on opposite sides of the body, preferably by cleaving the substrate 12 and the overlying layers along parallel atomic planes. A transverse waveguide effect is achieved using the "stripe" geometry of the laser 10, wherein an upper electrode 48 contacts the upper confining layer 24 only along a narrow stripe 50 (approximately 10 microns wide) formed in a groove of an insulating layer 52. The insulating layer is preferably $Si_3N_4$ and the stripe 50 is perpendicular to the facets. Thus, charge carriers are injected only along a narrow channel of the active region. This gives rise to a highly nonuniform distribution of carriers which modifies the refractive index within the plane of the active region. As a result, a narrow waveguide is produced along a channel of active material which underlies the stripe and extends between the facets 46.

The substrate 12 is provided with a broad area lower electrode 54 which reduces the contact resistance to P-type InP. Injection current is supplied to the upper and lower electrodes by upper and lower leads 56 and 58, respectively.

Figure 4:
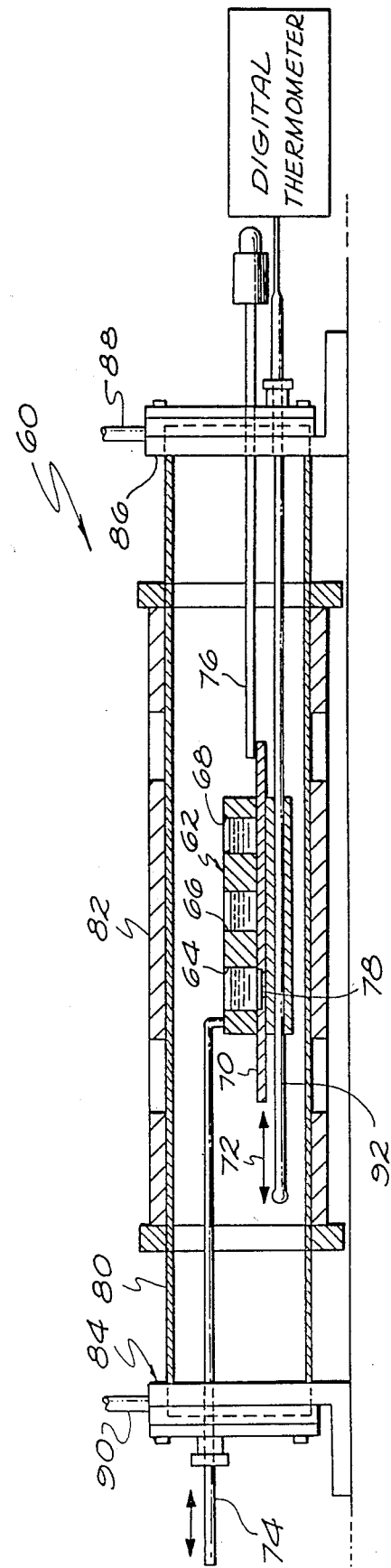
FIG. 4 is a schematic representation of a preferred apparatus for growing the layers of the device of FIG. 1 by liquid phase epitaxy.

The upper active layer 16 and the lower active layer 18 are grown by liquid phase epitaxy from a single melt using the apparatus 60 of FIG. 4. The apparatus includes a graphite boat 62 having compartments 64, 66 and 68 for holding semiconductor melts of different compositions. The boat 62 is similar to conventional boats in that each of the compartments has a bottom which is closed by a slider 70. The slider fits closely against the bottom of the boat so that the viscosity of the material within a compartment presents it from being pulled into an adjacent melt. The boat 62 and the slider 70 are mounted for relative movement in the longitudinal direction 72 by virtue of a push rod 74 connected to the boat and a rod 76 connected to the slider.

The substrate 12 of FIG. 1 is mountable within a recess 78 so that it is carried with the slider between positions beneath the different compartments of the boat. The depth of the recess and the thickness of the substrate are chosen so that the growth surface of the substrate is recessed sufficiently below the top of the slider to avoid being scratched. However, the growth surface must be close enough to the boat that excess material from one compartment will be wiped from the surface as the substrate moves to another compartment.

The graphite boat 62 is contained within a quartz growth tube 80 which is heated along its length by a three zone furnace 82. The temperature of the furnace is carefully monitored and controlled by suitable controllers (not shown). The growth tube is closed at its two ends by end caps 84 and 86, respectively. The push rod 74 and the slider rod 76 extend through the end caps for controlling the relative positions of the graphite boat 62 and the slider 70 and are provided with suitable air-tight fittings permitting the atmosphere in the tube to be controlled. The quartz tube 80 has a gas inlet 88 and a gas outlet 90 for evacuation, purging and otherwise affecting the gaseous environment within the tube. Finally, thermocouples are located at several positions along a thermocouple tube 92 to assist in monitoring and controlling the temperature.

In operation, the graphite boat 62 and the slider 70 are initially arranged so that the substrate is held within the slider at a location to the left of the three compartments. When the appropriate temperature is reached and growth is to begin, the slider rod 70 moves relative to the boat 62 to place the upper surface of the substrate in a first growth condition in which it is contacted by the melt contained within the first compartment 64. This can be accomplished by moving the push rod 74 to slide the graphite boats 62 to the left or by moving the rod 76 to actuate the slider 70 to the right. This first growth position is initially used to grow the lower confining layer 22 on the substrate 12.

After a confining layer of suitable thickness has been grown, the slider is moved to a second growth position in which the substrate is placed in contact with a melt of quaternary material within the second compartment 66 to grow the lower active layer 18. The quaternary material is deposited for a relatively short time, typically on the order of a few seconds, after which the slider is moved back to the first position for growth of the separation layer 20 from the melt in the first compartment 64. Thus, the separation layer is made of the same P-InP material as the lower confining layer, providing a suitable barrier for the two active layers. After the separation layer 20 has grown to approximately the same thickness as the lower active layer 18, the slider is again moved relative to the boat to place the substrate in the second growth position beneath the second compartment 66 for growth of the other active layer 16. This process of shifting back and forth between the first and second growth positions can be repeated any number of times to form a composite active region 14 having a desired number of active layers spaced apart by suitable separation layers. After the last active layer is completed, the substrate is moved to a third growth position beneath the compartment 68 for deposition of N-InP from the melt therein.

The device prepared by the method described above has an output represented by the combined outputs of the various active layers and exhibits superior carrier confinement. For such a device to be useful, it is necessary for the active layers to have almost identical chemical and structural makeup. This occurs only if the layers are very thin, so that the concentration of dilute constituents is not appreciably changed from the first active layer to the last, and if the temperature change of the melts is slow enough for all layers to be deposited at substantially the same temperature.

Figure 5:
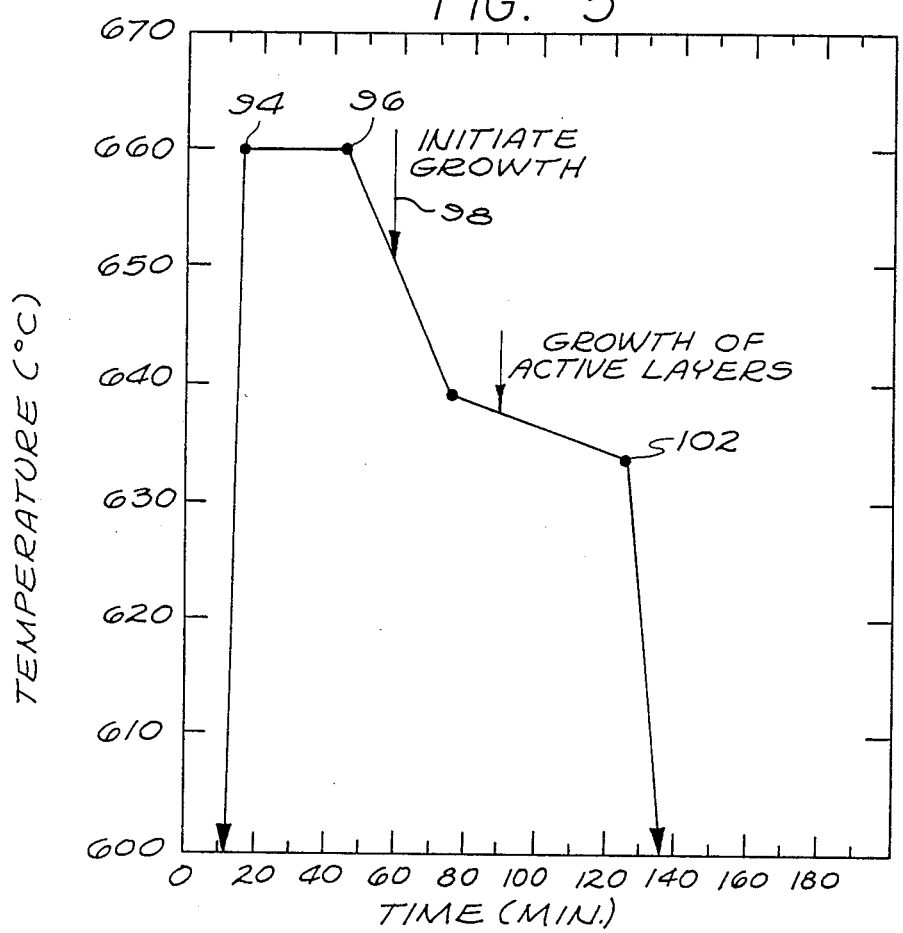
FIG. 5 is a graph of the heating and cooling schedule followed during growth of the device of FIG. 1.

A preferred heating and cooling schedule used in the growth of the laser 10 is illustrated in FIG. 5. The boat is initially heated to a saturation point 94 and is held at that temperature for approximatly 30 minutes. Cooling is then begun (point 96) at a rate of approximately 0.7 degrees per minute to take the melts into the range of supersaturation. Growth of the lower confining layer 22 is commenced at 650 degrees Celsius, as indicated at 98. This continues until approximately 640 degrees Celsius, whereupon the cooling rate is reduced to approximately 0.1 degree per minute. After an elapsed time of approximately 50 minutes from the point 98, growth of the lower active layer 18 is commenced by sliding the substrate relative to the boat 62 (FIG. 4) to the first growth position described above. At this point the temperature of the quaternary melt is approximately 635 degrees Celsius, which is slightly below its equilibrium temperature. Growth of the lower active layer 18, the separation layer 20, the upper active layer 16 and the upper confining layer 24 all take place at the slow cooling rate as the substrate is moved between compartments in the manner described above. After the upper confining layer 24 is grown to its intended thickness (approximately 2 microns), growth is aborted by sliding the substrate out from under the melt and rapidly cooling the boat.

The cooling schedule of FIG. 5 is important in the present invention because the slow cooling rate (approximately 0.1 degree per minute) and short growth periods (between 2 and 30 seconds per active or separation layer) assures that all active layers are grown at substantially the same temperature and that the composition of the melt used to form the active layers is substantially constant over the growth period. The average temperature of growth for the active layers is preferably within approximately 2 degrees of the equilibrium temperature of the quaternary melt.

The active layers and the separation layer are each typically grown for 10 seconds or less, yielding a total elapsed time of no more than 30 seconds from beginning of the lower active layer to completion of the upper active layer. During this time, the temperature of the melt changes by only 0.05 degrees.

Two samples of the laser of FIG. 2 were grown using melts with the following constituents:

TABLE I

GROWTH CONSTITUENTS FOR THE P-DCC LASER

| Compart-ment | Mass Of | | | | | |
|---|---|---|---|---|---|---|
| | In (g) | InP (mg) | GaAs (mg) | InAs (mg) | Sn (mg) | Zn (mg) |
| 64 | 2.000 | 17.0–18.0 | 0 | 0 | 0 | 0.07 |
| 66 | 2.000 | 11.0 | 25.0 | 145.5 | 0 | 0.05 |
| 68 | 2.000 | 20.0 | 0 | 0 | 80.0 | 0 |

(Note: Zinc was added in the form of an In—Zn premelt containing 10 percent zinc by weight.)

Other parameters for the growth of the two samples, identified herein as R53 and R54, are shown in the following Tables:

TABLE II

GROWTH SUMMARY - R53

| Lay-er | Layer Compo-sition | InP Melt Content (mg) | Initial Growth Temp (°C.) | Growth | | |
|---|---|---|---|---|---|---|
| | | | | Time (min) | Thick-ness ($\mu$m) | Rate ($\mu$m/min) |
| A | InP(Zn) | 18.0 | 649.8 | 50 | 4.75 | 0.1 |
| B | Q1*(Zn) | 11.0 | 635.0 | 0.07 | 0.12 | 1.71 |
| C | InP(Zn) | † | 635.0 | 0.07 | 0.10 | 1.43 |
| D | Q1*(Zn) | † † | 634.9 | 0.07 | 0.12 | 1.71 |
| E | InP(Sn) | 20.0 | 634.8 | 20 | 6.62 | 0.33 |

TABLE III

GROWTH SUMMARY - R54

| Lay-er | Layer Compo-sition | InP Melt Content (mg) | Initial Growth Temp (°C.) | Growth | | |
|---|---|---|---|---|---|---|
| | | | | Time (min) | Thick-ness ($\mu$m) | Rate ($\mu$m/min) |
| A | InP(Zn) | 17.0 | 649.9 | 50.25 | — | — |
| B | Q1*(Zn) | 11.0 | 635.0 | 0.03 | 0.06 | 2.0 |
| C | InP(Zn) | † | 635.0 | 0.03 | 0.03 | 1.0 |
| D | Q1*(Zn) | † † | 635.0 | 0.03 | 0.06 | 2.0 |

TABLE III-continued

GROWTH SUMMARY - R54

| Lay-er | Layer Compo-sition | InP Melt Content (mg) | Initial Growth Temp (°C.) | Growth | | |
|---|---|---|---|---|---|---|
| | | | | Time (min) | Thick-ness ($\mu$m) | Rate ($\mu$m/min) |
| E | InP(Sn) | 20.0 | 635.0 | 21.0 | 3.21 | 0.15 |

*Q1   $In_{.71}Ga_{.29}As_{.63}P_{.37}$
† Reuse melt of Layer A
† † Reuse melt of Layer B The layers grown by liquid phase epitaxy are identified in Tables II and III by the letters A–E, which refer to the layers in the order of deposition. Thus, layer A is the lower confining layer 22, layer B is the lower active layer 18, layer C is the separation layer 20, layer D is the upper active layer 16, and layer E is the upper confining layer 24. Although the contents of the melts used to form the layers are identified briefly in Tables II and III, a more detailed lift of ingredients is found in Table I. It can be seen that a single melt is used to deposit layers A and C and a different melt is used to deposit both of the active layers B and D.

In growing the layers of the devices R53 and R54, 2.000 g In ingots (6N purity) were loaded in each compartment of the boat and the growth tube was flushed with ultra high purity nitrogen. The system was then evacuated and purged with ultra high purity hydrogen. When the oxygen content of the hydrogen dropped to an acceptable level (less than 1 ppm) the furnace was heated to 800 degrees Celsius for 15–20 hours to remove impurities in the indium. After the indium bakeout, the boat was cooled and purged with nitrogen and appropriate amounts of the remaining components were added to the melts. The melts were then homogenized at 660 degrees Celcius for four hours in a hydrogen atmosphere. The p-type dopant (zinc) was not added at this stage because it has a high vapor pressure. Rather, the apparatus was cooled before the substrate and the zinc were loaded into it. The system was then heated to 660 degrees Celsius and held there for 30 minutes to stabilize its temperature, after which the growth sequence of FIG. 5 was followed. The multiple cooling rates of FIG. 5 were used to grow thin active layers without substantially increasing the total growth time of the structure. The fast initial cooling rate also reduced the amount of time that the substrate was exposed to heat before initiating growth, diminishing the chance of thermal dissociation of the substrate by phosphorous evaporation.

The substrates used to grow the sample devices were made of single crystal P-InP approximately 450 microns thick. The substrates were oriented (100) and served as the "seeds" for epitaxial growth. The initial thickness of the substrates was selected to avoid breakage during growth; however, a thinner layer is desired to facilitate cleaning and reduce thermal resistance. Thus, the wafers were lapped to a thickness of approximately 100 microns before deposition of contacts and annealing. After the contacts were deposited, the wafers were cleaved into bars and diced into individual broad area laser diodes of the type illustrated in FIG. 1.

The insulating layer 52 (FIG. 2) was a film of $Si_3N_4$ deposited by planar RF sputtering to a thickness of betweeen 1200–1400 angstroms. The system employed a silicon target in an atmosphere of pure nitrogen. After deposition of the layer 52, a groove was formed through the thickness of the layer using photolithographic and plasma etching techniques before the metal contact 48 was deposited.

The deposition of a low resistivity ohmic contact to the upper confining layer 24 was straightforward because N-InP has a low Schottky barrier. Standard Au/Ge-Ni-Au contacts were used. However, it was somewhat more difficult to obtain a low resistivity contact on the P-InP substrate. The contacts used in the devices R53 and R54 were formed by evaporating 800 angstroms of Au/Be (3 percent Be, by weight) on the lower surface of the substrate followed by 200 angstroms of chromium. The chromium served as a barrier to indium and phosphorous outdiffusion whereas the Be provided a highly P-doped region at the metal-semiconductor interface. A 1000 angstrom layer of gold was deposited over the chromium to prevent it from oxidizing.

After the contacts were deposited, the samples were treated by heating and rapidly cooling them in a hydrogen atmosphere, employing various anneal times and temperatures. A 1000-2000 angstrom layer of pure gold was deposited after the anneal to facilitate wire bonding of the leads 56 and 58. The optimum annealing temperature and time was observed to be 410 degrees Celsius and 3-4 minutes, respectively. These conditions yielded contacts with $r_c$ values of $5 \times 10^{-5}$ ohm-cm$^2$.

Figure 8A:
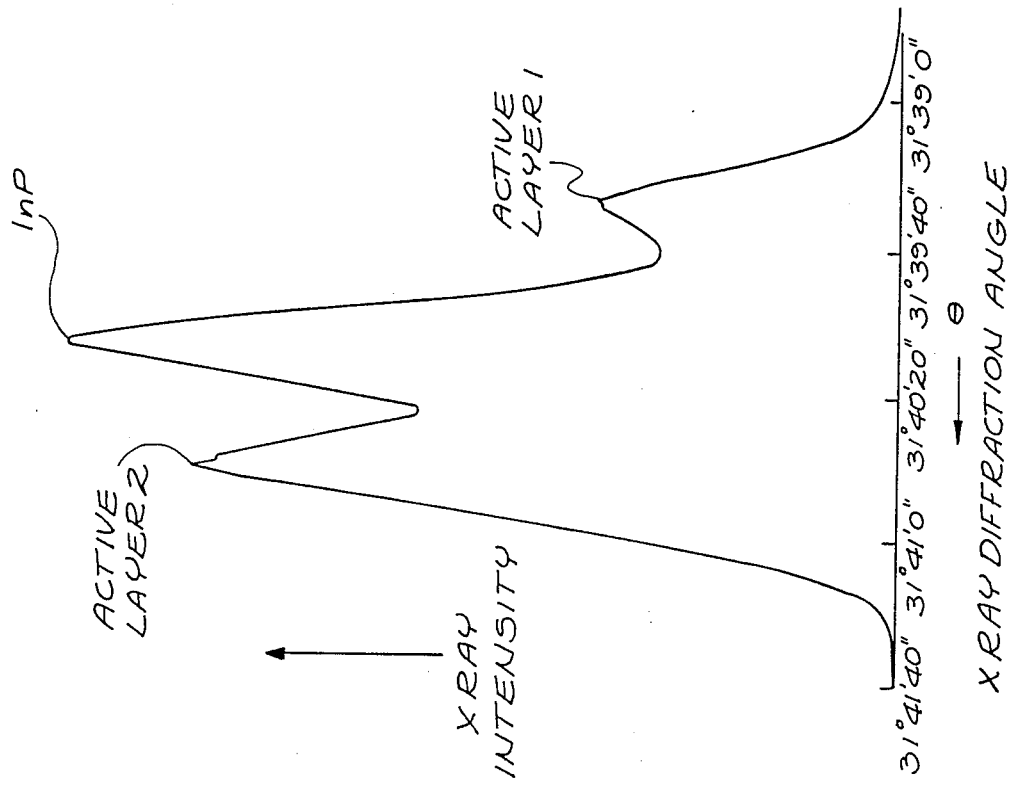
FIG. 8A is a graph of the X-ray rocking curve of a heterostructure laser grown using the 3-melt technique of the present invention.
Figure 8B:
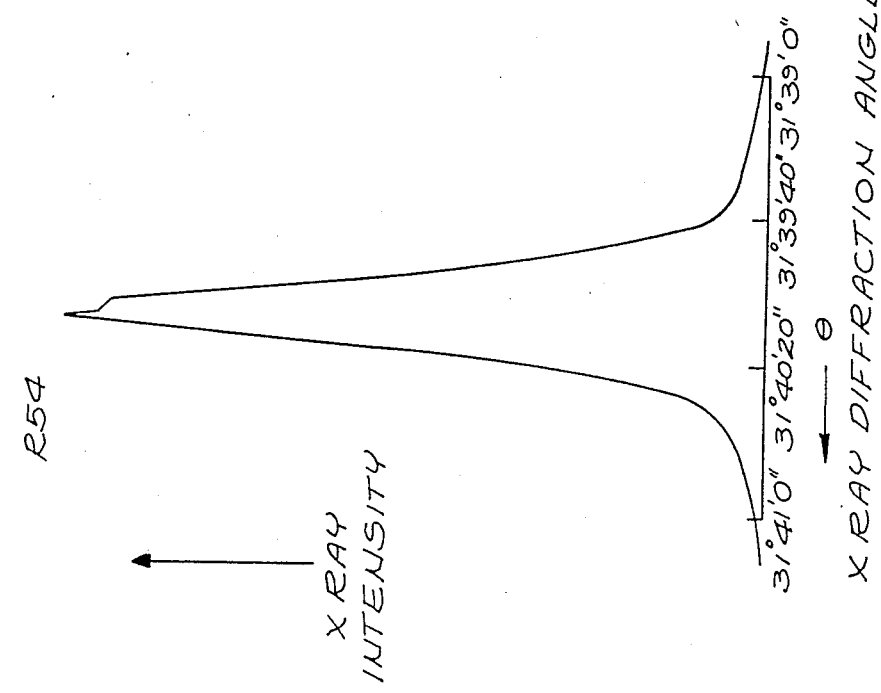
FIG. 8B is a graph of the X-ray rocking curve of a heterostructure laser grown on an n-type substrate using five different melts.

The total lattice mismatch of the wafers grown by the three melt technique was measured using a double crystal X-ray diffractometer. Lattice mismatch is represented by $(a_2 - a_1)/a_0$, where $a_0$, $a_1$ and $a_2$ are the lattice parameters of the substrate, the first active layer and the second active layer, respectively. Layers were reproducibly grown using this technique with a lattice mismatch of less than $2 \times 10^{-5}$ for all layers, as shown in FIG. 8A. The typical mismatch of DCC wafers grown with 5 melts on an n-type InP substrate is an order of magnitude higher. X-ray diffraction measurements for such a wafer are illustrated in FIG. 8B for comparison.

Device R53 exhibited a room temperature pulsed threshold current density of 2.8 kA/cm$^2$ in the 10 micron stripe geometry, compared to a lowest reported value of 4.6 kA./cm$^2$ for DCC lasers with similar device dimensions. $J_{th}$ values as low as 2.2 kA/cm$^2$ were exhibited by stripe geometry devices with much thinner active and separation layers. Device R54 exhibited this latter value with active layers of 600 angstroms and a separation layer of 300 angstroms. Thus, the substrate and growth methods of the present invention maximize the overlap of modal gain from two identical active layers, yielding a device with low threshold current.

Figure 6:
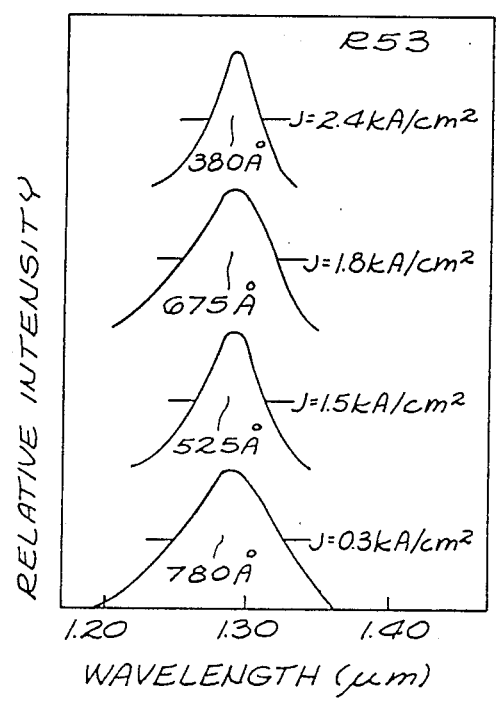
FIG. 6 is a graph of envelopes defined by the spontaneous emission spectra of the laser at various current densities.
Figure 7:
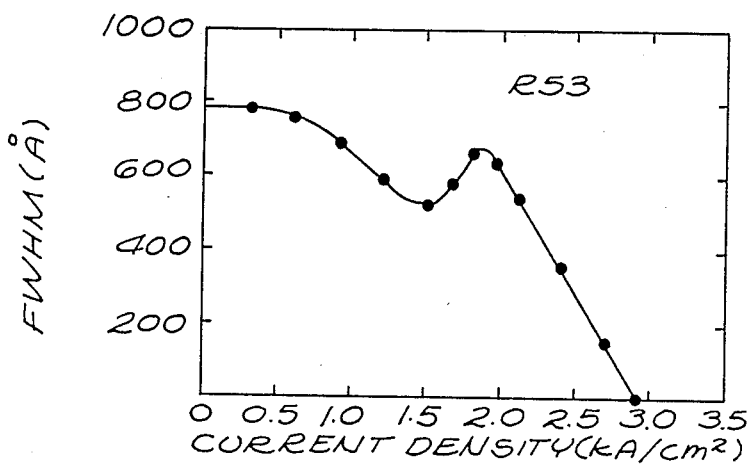
FIG. 7 is a graph of the FWHM of the emission spectra of FIG. 6.

Direct evidence of the compositional homogeneity between the two active layers is demonstrated by the spontaneous emission spectra of the lasers at various current density levels (J). As J is increased, the spectral envelope narrows as expected, but then broadens near $J = 0.5\ J_{th}$ before narrowing again and finally lasing (FIG. 7). This increase in the full width at half maximum (FWHM) of the spontaneous emission spectra at approximately $0.5\ J_{th}$ is a measure of the uniformity of the two active layers, since light from both active layers contributes to the half width. With wafers in which the active regions are grown from the same melt, a maximum FWHM of 675 angstroms is observed near $J = 0.5\ J_{th}$. This is less than the low current FWHM of 800 angstroms and indicates that the characteristic wavelengths of the two active regions are within approximately 20 angstroms of each other. The FWHM of 675 angstroms contrasts with the results of Yano et al., who disclosed values of approximately 900 angstroms at $0.5\ J_{th}$ in the best case. In addition, the spontaneous emission spectra of the lasers of the present invention have conventional Lorentzian envelopes (FIG. 6) as opposed to the distorted, Lorentzian-like envelopes described in the prior art. It has been observed that threshold current density decreases as the maximum FWHM (near $0.5\ J_{th}$) decreases. Applicants' results clearly support this observation.

Figure 10:
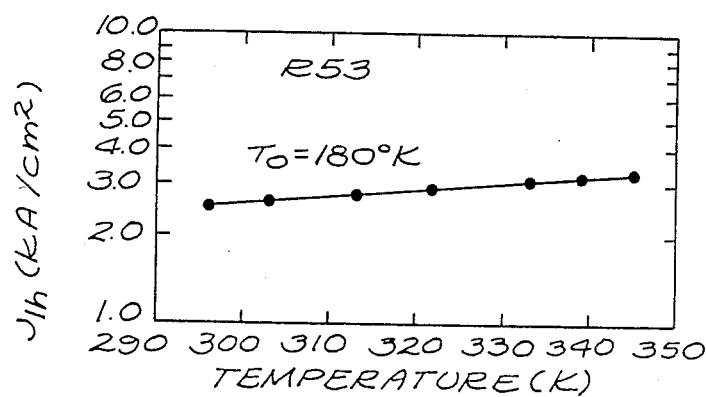
FIG. 10 is a graph of the temperature dependence of the threshold current density.

The lasers of the present invention also exhibit high temperature stability because their active layers are the same in composition and lattice parameters. The temperature stability of the wafer R53 was particularly good with $T_o$ values of 180 degrees Kelvin in an operating range of 295-345 degrees Kelvin (FIG. 10). $T_o$ values of 106 degrees Kelvin were observed for the device R54, which had a very thin separation layer. This value is still considerably higher than that of a typical InGaAsP/InP heterojunction laser, in which $T_0$ is approximately 50-70 degrees Kelvin. However, the fact that it is below that of wafer R53 indicates that a considerable amount of carrier leakage is present.

Electron leakage from the first active layer is the source of electrons in the second well (FIG. 3). The diffusion component of the leakage current dominates the drift component since the ratio of drift to diffusion is proportional to the thickness (t) of the separation layer, which is an order of magnitude thinner than the lower confining layer of a conventional heterojunction laser. In addition, the diffusion component of the leakage current varies inversely with t, so that increasing t reduces the number of electrons which leak into the second active region. This is consistent with the results described above in which a thicker separation layer gave rise to a higher $T_o$ value but a higher threshold current as well.

Figure 9:
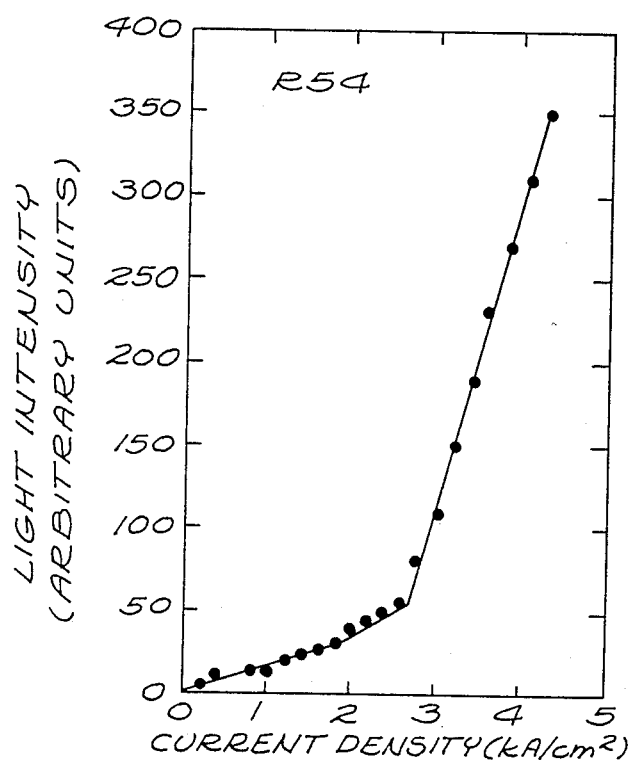
FIG. 9 is a graph of the light intensity of the laser as a function of injection current density.

The optical power output of the lasers of the present invention was measured as a function of injection current to determine the threshold level of the devices. A typical light output versus input current curve is depicted in FIG. 9.

From the above, it can be seen that the heterostructure laser of the present invention has a low threshold current and high thermal stability, and can be grown to operate at wavelengths which fall within the low loss and low dispersion range of conventional optical fibers.

While certain specific embodiments of the invention have been disclosed as typical, the invention is not limited to these particular forms but rather is applicable broadly to all such variations as fall within the scope of the appended claims. As an example, other chemical systems, such as ternary systems, might be substituted for the binary and quarternary materials used for the layers of the disclosed device, or the device can be provided with more than two active layers. Similarly, the "stripe" configuration of the device 10 is not the only form the device can take. One form which is particularly promising using the growth techniques of the present invention is a buried heterostructure laser having multiple active regions. Such a laser can be produced using the same materials and parameters described herein, the only significant difference being the removal of active material outside the lasing region.

What is claimed is:

1. In a semiconductor laser of the heterostructure type, the improvement comprising:
    a p-type substrate having lower electrode means for establishing electrical connection thereto;

a p-type lower confining layer overlying the substrate;

a composite active region formed on the lower confining layer, the composite region having at least two p-type active layers separated by one or more p-type separation layers, the active layers being of substantially identical composition, and the active layers and the confining layers each being at least 300 angstroms thick;

an n-type upper confining layer formed on the composite active region to produce a p-n junction therewith;

upper electrode means for establishing electrical connection to the upper confining layer;

the active layers having band gaps smaller than the band gaps of the confining layers and the separation layers; and means for applying an electrical potential between the upper electrode means and the lower electrode means to inject charge carriers into the active layers.

2. The semiconductor laser according to claim 1 wherein:

the active layers are each at least 600 angstroms thick.

3. The semiconductor laser of claim 2 wherein:

light emitted by each active layer under spontaneous emission has a peak intensity at a wavelength characteristic of the active layer; and said wavelengths characteristic of the active layers are within 50 angstroms of each other.

4. The semiconductor laser of claim 3 wherein:

said wavelengths characteristic of the active layers are within 20 angstroms of each other.

5. The semiconductor laser of claim 2 wherein:

the output spectrum of the laser defines an envelope having a full width at half maximum which varies with injection current; and the full width at half maximum has its highest value below the current range within which stimulated emission contributes substantially to output.

6. The semiconductor laser of claim 2 wherein: the active layers are crystalline and have a lattice mismatch of less than $3 \times 10^{-4}$.

7. The semiconductor laser of claim 6 wherein:

any lattice mismatch between the active layers is $2 \times 10^{-5}$ or less.

8. The semiconductor laser of claim 2 wherein:

the active layers are each approximately 0.1 micron thick.

9. The semiconductor laser of claim 2 wherein:

the upper electrode means is a stripe electrode.

10. The semiconductor laser of claim 2 wherein:

the active layers are grown from a single melt.

11. The semiconductor laser of claim 10 wherein:

the upper and lower active layers comprise a solid solution of indium, gallium, arsenic and phosphorous.

12. The semiconductor laser of claim 10 wherein:

the lower confining layer and the separation layer are grown from a single melt which is different from that used to grow the active layers.

13. The semiconductor laser of claim 12 wherein:

the upper and lower active layers comprise a solid solution of indium, gallium, arsenic and phosphorous; and the lower confining layer and the separation layer comprise a solid solution of indium and phosphorous.

14. The semiconductor laser of claim 2 wherein the threshold current density ($J_{th}$) is represented by the expression $J_{th} = J_{tho} e^{T/T_0}$ and in which:

T is the temperature of the device above a preselected reference temperature;

$J_{tho}$ is a constant equal to the threshold current at the reference temperature;

$T_o$ is approximately 180° K. or greater; and $J_{th}$ at room temperature is less than or equal to 2.8 kA/cm².

15. In a semiconductor laser of the heterostructure type, the improvement comprising:

a substrate having lower electrode means for establishing electrical connection thereto;

a lower confining layer overlying the substrate;

a composite active region formed on the lower confining layer, the composite region having at least two active layers separated by one or more separation layers, the active layers being of substantially identical composition, and the active layers and the confining layers each being at least 300 angstroms thick;

an upper confining layer formed on the composite active region;

upper electrode means for establishing electrical connection to the upper confining layer;

the active layers having band gaps smaller than the band gaps of the confining layers and the separation layers; and means for applying an electrical potential between the upper electrode means and the lower electrode means to inject charge carriers into the active layers;

the substrate and the lower confining layer being of a first conductivity type, the upper confining regions being of a second conductivity type which is opposite to the first conductivity type, and the composite active region as a whole being of either the first or second conductivity type.

* * * * *

UNITED STATES PATENT AND TRADEMARK OFFICE
CERTIFICATE OF CORRECTION

PATENT NO. : 4,788,688
DATED : November 29, 1988
INVENTOR(S) : Thomas C. Hasenberg and Elsa M. Garmire It is certified that error appears in the above-identified patent and that said Letters Patent is hereby corrected as shown below:

IN THE SPECIFICATION:

Col. 1, line 5, delete "F49629-85-C-0071" and substitute therefor --F49620-85-C-0071--.

Signed and Sealed this

Twenty-second Day of August, 1989

Attest:

DONALD J. QUIGG

Attesting Officer

Commissioner of Patents and Trademarks